United States Patent [19]

Nishizawa

[11] Patent Number: 4,799,090
[45] Date of Patent: Jan. 17, 1989

[54] TUNNEL INJECTION CONTROLLING TYPE SEMICONDUCTOR DEVICE CONTROLLED BY STATIC INDUCTION EFFECT

[75] Inventor: Jun-ichi Nishizawa, Sendai, Japan

[73] Assignee: Zaidan Hojin Handotai Kenkyu Shinkokai, Sendai, Japan

[21] Appl. No.: 314,496

[22] Filed: Oct. 23, 1981

[30] Foreign Application Priority Data

Oct. 28, 1980 [JP] Japan .................. 55-151849

[51] Int. Cl.⁴ .............. H01L 29/88; H01L 29/36; H01L 29/20
[52] U.S. Cl. ................................ 357/12; 357/13; 357/23.1
[58] Field of Search .............. 357/12, 13, 67, 86, 357/23.1

[56] References Cited

U.S. PATENT DOCUMENTS

| | | | |
|---|---|---|---|
| 2,933,619 | 4/1960 | Heywang | 357/12 |
| 3,278,812 | 10/1966 | Gow, 3rd | 357/12 |
| 3,309,586 | 3/1967 | Kleinknecht | 357/12 |
| 3,462,700 | 8/1969 | Berglund et al. | 357/12 |
| 3,906,540 | 9/1975 | Hollins | 357/67 |
| 4,106,043 | 8/1978 | Culshaw | 357/13 |
| 4,149,174 | 4/1979 | Shannon | 357/13 |
| 4,271,424 | 6/1981 | Inayoshi et al. | 357/86 |
| 4,316,209 | 2/1982 | Ho et al. | 357/67 |

OTHER PUBLICATIONS

Margalit et al., "Field Induced Tunnel Diode in Indium Antimonide", Journal of Applied Physics, vol. 46, No. 9, pp. 3999–4001, Sep. 1975.

Primary Examiner—Andrew J. James
Assistant Examiner—John Lamont
Attorney, Agent, or Firm—Spensley Horn Jubas & Lubitz

[57] ABSTRACT

A tunnel injection controlling type semiconductor device comprising a source semiconductor region having a certain conductivity type for supplying carriers, a drain semiconductor region for receiving the carriers, and a gate electrode for controlling the flow of these carriers. A highly-doped semiconductor region having a conductivity type opposite to that of the source semiconductor region is provided in contact with the source region or contained locally in the source region to cause tunnel injection of carriers. The potential level of this highly-doped region is varied by virtue of the static induction effect exerted by the voltage applied to the gate electrode which is provided at a site close to but separate from the highly-doped region, and to the drain semiconductor region.

27 Claims, 4 Drawing Sheets

TUNNEL INJECTION CONTROLLING TYPE SEMICONDUCTOR DEVICE CONTROLLED BY STATIC INDUCTION EFFECT

BACKGROUND OF THE INVENTION (a) Field of the invention

The present invention relates to a new semiconductor device which is capable of attaining the goal of size reduction and of extremely high operating speed which conventional semiconductor devices have not realized. More particularly it pertains to a semiconductor device comprising an electrode (which is called the source electrode) for injecting carriers and another electrode (which is called the drain electrode) for receiving these carriers. The potential distribution existing in the foreground of the source electrode is controlled by virtue of a static induction effect by the voltage applied to still another electrode, which is a controlling electrode, to thereby control the tunnel injection current from the source electrode.

(b) Description of the prior art

Conventional transistors which are operated based on the principle of controlling of carrier injection include, typically, bipolar transistors (hereinafter to be referred to as BPT) and static induction transistors (hereinafter to be referred to as SIT). In a BPT, the potential of the base region relative to the emitter region thereof is controlled, via a base resistance, by the voltage applied to the base electrode which serves as the controlling electrode, to thereby control the amount of minority carriers which flow into the base region from the emitter region. On the other hand, in an SIT, the channel region through which a current is allowed to flow is almost or completely depleted, and the potential which this channel region has is controlled, via the capacitance of said depletion layer, by the voltage applied to the gate electrode which is the controlling electrode, i.e. capacitive control, to thereby control the amount of carriers injected into the drain region from the source region. In each of these two types of conventional transistors, the flow of current is controlled by varying the amount of those carriers having such thermal energy as allowing them to pass over the potential barrier, by varying the height of this potential barrier. Therefore, in such conventional SITs, those carriers which pass over the potential barrier will gather at the foreground of the potential barrier. In such instance, the pattern of conduction mechanism of conventional BPT and SIT is inevitably accompanied by a carrier storage effect between the source region or emitter region and the potential barrier height. In contrast thereto, tunnel injection does not follow such pattern. Accordingly, in the conventional devices, there still exists some carrier storage effect, though not so large, between the region where a potential barrier is produced and the region where either the source region or emitter region is formed. This carrier storage effect has, in the past, constituted a cause of limitation to the speed in materializing ultra-high speed operation.

SUMMARY OF THE INVENTION

It is the object of the present invention to provide a semiconductor device which is substantially completely devoid of such carrier storage effect as described above, and which is capable of being operated at an extremely high speed.

The present invention will hereunder be described in further detail with respect to some preferred embodiments by referring to the accompanying drawings.

BRIEF DESCRIPTION OF THE DRAWINGS

FIG. 3 is a chart showing the potential distribution in the channel region from the source region toward the drain region, in which:

DETAILED DESCRIPTION OF THE PREFERRED EMBODIMENTS

Before explaining the present invention, description will first be made of the tunnel current in the case when a reverse bias voltage is applied to a diode having a p+n junction. The tunnel current density J is given by the following formula for materials having direct band gap structure:

$$J = \frac{\sqrt{2} \; q^3 m^{*\frac{1}{2}} V_a}{4\pi^3 \; h^2 \; \epsilon_g^{\frac{1}{2}}} \exp\left( - \frac{\pi m^{*\frac{1}{2}} \epsilon_g^{3/2}}{2\sqrt{2} \; q E h} \right), \quad (1)$$

wherein:

q represents a unit electric charge;

m* represents an effective mass;

h is equal to $2\pi\hbar$ and represents Plank's constant;

$\epsilon_g$ represents an energy band gap;

$V_a$ represents an applied voltage; and

E represents the maximum intensity of the electric field of the p+n junction, and is given by the following formula:

$$E = \left\{ \frac{2qN_D (V_a + V_{bi})}{\epsilon_s} \right\}^{\frac{1}{2}}, \quad (2)$$

wherein:

$N_D$ represents the impurity concentration of the n type semiconductor region;

$\epsilon_s$ represents a dielectric constant; and $V_{bi}$ represents a built-in voltage of the p+n junction.

Figure 1:
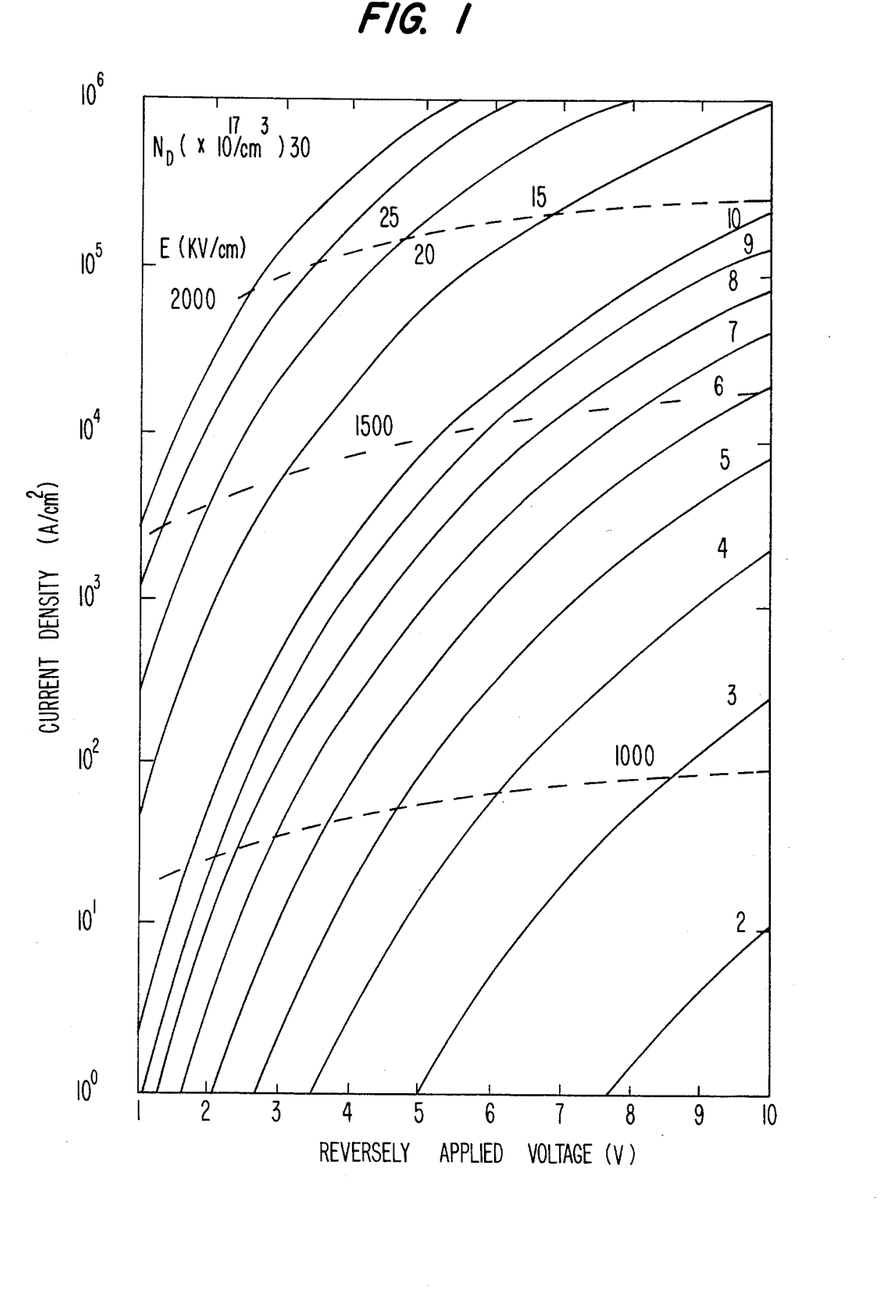
FIG. 1 is a chart showing the result of calculation of tunnel current at the application of reverse voltage across the p+n junction, in case the semiconductor material employed is GaAs.

FIG. 1 shows the dependency of the reverse tunnel current density of the p+n junction upon the reversely applied voltage $(V_a + V_{bi})$ as given by the formulas (1) and (2) in case calculation is made on the semiconductor material which is GaAs (gallium arsenide). $\epsilon_g = 1.43$ eV, and $\epsilon_s = 10.9\; \epsilon_o$. ($\epsilon_o$ represents the dielectric coefficient in vacuum.) m* is expressed by $(1/m^*_e + 1/m^*_{lh})^{-1}$ and the effective mass of an electron $m^*_e$ is $0.068 m_o$, and the effective mass of a light hole $m^*_{lh}$ is $0.12 m_o$, wherein $m_o$ represents the mass of a free electron. In FIG. 1 is shown current density in solid lines, and concurrently the intensity of electric field is shown in dotted lines. $N_D$ represents the impurity concentration of the n type semiconductor region. As the value of $N_D$ increases, the width of the depletion layer becomes narrower for the same reverse applied voltage, and thereby the electric field intensity becomes greater. Accordingly, the tunnel current density becomes greater. For example, if $N_D = 3 \times 10^{18} \text{cm}^{-3}$, there can be obtained such high tunnel current density as $3 \times 10^3 \text{A/cm}^2$ at such low value of reverse voltage as 1V.

The semiconductor device structure which is arranged so that the tunnel current as shown in FIG. 1 which flows from the drain region to the source region is controlled by the voltage applied to the gate electrode which is the controlling electrode, and also by the voltage applied to the drain electrode, is the semiconductor device according to the present invention.

Figure 2:
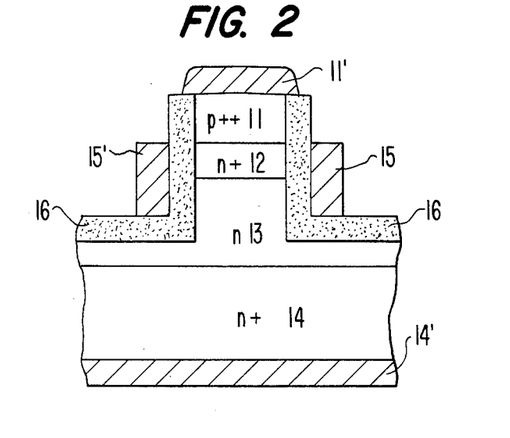
FIGS. 2, 4 through 8 and 10 are diagrammatic sectional views showing the semiconductor device structures according to the present invention.

In FIG. 2 is shown a basic sectional view of the transistor structure which is one of the embodiments of the present invention. Reference numeral 11 represents a p++ type source region; 14 an n+ type drain region; and 15 and 15' gate electrodes, respectively. These gate electrodes serve to control the potential distribution of the n+ type region 12 and of the n type region 13 which jointly constitute a current path via an insulation film 16. Regions 11' and 14' represent a source electrode and a drain electrode, respectively. The impurity concentrations and the sizes of the region 12 and the region 13 are designed so that these regions become almost or completely depleted in the operative state. The impurity concentrations of the respective regions are designed as follows, though they may vary depending on the distance between the gate regions. That is, $5 \times 10^{19} - 1 \times 10^{21} \text{ cm}^{-3}$ for the p++ type region 11; $5 \times 10^{17} - 1 \times 10^{19} \text{ cm}^{-3}$ for the n+ type region 12; $1 \times 10^{14} - 1 \times 10^{17} \text{ cm}^{-3}$ for the n type region 13; and $1 \times 10^{18} - 5 \times 10^{20} \text{ cm}^{-3}$ for the n+ type region 14. The impurity concentrations of the n+ type region 12 and of the n type region 13 are designed to be higher as the distance between the gate regions is set smaller, and also as the distance between the source region and the drain region is set smaller. In other words, the impurity concentrations of these two regions 12 and 13 can be set higher as the sizes of the respective constituting regions are designed finer. Therefore, as the sizes of the respective regions, and accordingly the size of the device as a whole, are reduced further, it becomes possible to obtain a higher tunnel current density. The gate-to-gate interval is, for example, from less than 2μm up to about 1000Å. The distance between the source region and the drain region is set to be in the range from about 1000Å to about 2-3 μm. The thinner the insulation film 16 which is provided contiguous to the n+ type region 12 is, the more effectively will the gate voltage be applied to the n+ type region 12.

The operating mechanism of the semiconductor device of the present invention will be described below.

Figure 3A:
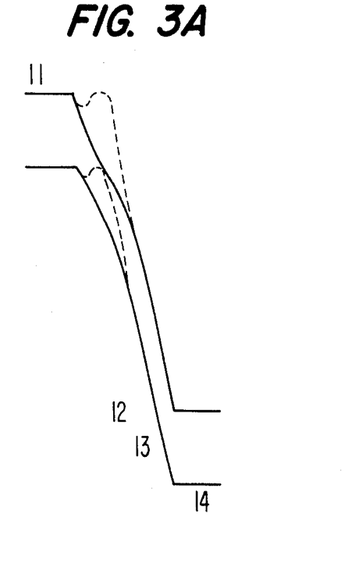
FIG. 3A is a chart showing the abovesaid potential distribution in the non-conducting state of the device.
Figure 3B:
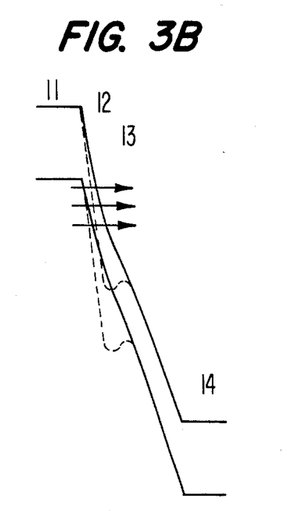
FIG. 3B is a chart showing the abovesaid potential distribution in the conducting state of the device.

In the device of FIG. 2, the potential distribution in the channel region leading from the source region toward the drain region is operated by applying a positive voltage to the drain electrode with respect to the source electrode, as shown in FIGS. 3A and 3B. FIG. 3A shows the instance wherein the gate region is held at zero potential, i.e. at a potential identical with the source region. The dotted line indicates the potential distribution from the source region toward the drain region in that portion of the channel region located close to the gate electrode. The solid line indicates the potential distribution in the central portion of the channel region in the direction from the source region toward the drain region. Owing to the presence of a gate voltage, the potential distribution gradient in the channel region due to the static induction effect via the depletion layer follows a gentle pattern as shown by the solid line. That is, owing to the small intensity of an electric field, there does not take place a tunneling phenomenon, and no tunnel current flows. In this device, under such a bias condition, the current from the drain region toward the source region is in its "off" state. FIG. 3B shows the instance in which a positive voltage is applied to the gate electrode with respect to the source electrode. A dotted line indicates the potential distribution from the source region toward the drain region in that portion of the channel region located close to the gate electrode, similar to FIG. 3A. The solid line shows the potential distribution at the central portion of the channel region, in the direction from the source region toward the drain region. By the application of a positive voltage to the gate electrode with respect to the source electrode, the potential gradient in the center of the channel region is rendered steep in the foreground of the source region due to the static induction effect applied via the depletion layer, i.e. the field effect intensity E becomes very large, and there develops such tunneling phenomenon as shown by the arrow, and thus a tunnel current flows. That is, in this state, the current from the drain region toward the source region is in its "on" state. As shown in FIGS. 3A and 3B, the potential distribution in the channel region which serves as the current path is controlled via the capacitance of the depletion layer, i.e. due to the static induction effect, and thus the tunnel current is controlled. For this reason, the transistor according to the present invention is named "Static Induced Tunnel Transistor (which is abbreviated as SITT)" by the present inventor.

As described above, when it is intended to cause a tunnel current to flow, it is desirable that the impurity concentration of the n+ type region 12 is set high, and that its thickness is set small. The thickness is set, for example, at about 0.2 μm to 0.03 μm, or less. In case the thickness of the n+ type region is set small the interval between the gate regions requires to be set small also. This is for the purpose of causing a current to flow by further effectively controlling the entire region of the channel. Thus, the distance between the gate regions is set narrow, such as about 1 μm to about 0.1 μm.

Figure 4:
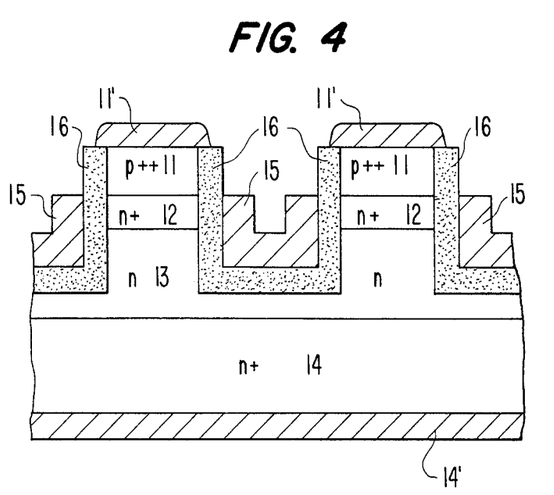

FIG. 4 shows the sectional view of the device which is achieved by modifying the structure of FIG. 2 into a multiple channel structure. The reference numerals of the respective regions correspond to those of FIG. 2.

Figure 5:
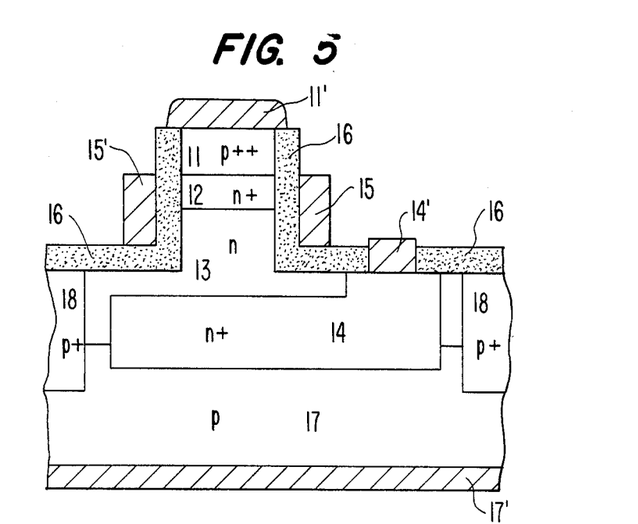

Similarly, the structure of FIG. 2 which is modified into a planar type is shown in FIG. 5. That is, FIG. 5 shows the instance wherein a transistor of the present invention is formed on a p type semiconductor substrate 17, and an n+ type drain region 14 is constructed as a buried region. In this Figure, a p+ type region 18 is provided as an electrical isolation region. However, such electrical isolation need not be achieved by this region 18, but alternatively it may be accomplished by the use of an insulator, or further alternatively, isolation may be obtained by forming a recess to extend to reach as far as the n+ type region 14. This latter arrangement will simplify the manufacturing process further. The electrode 17' need not be provided on the rear side of the device. In this embodiment, the p type substrate is replaced by a semi-insulating substrate, for example, in a GaAs device. Moreover, the isolation p+ type region 18 is replaced by a semi-insulating region by relying on Proton or Helium bombardment in the GaAs device.

In case the semiconductor material employed in the device is silicon, the insulation layer 16 may be formed with such substance as $SiO_2$, $Si_3N_4$, $Al_2O_3$ and AlN or their composite film. Also, in case the semiconductor material in GaAs, the insulation layer 16 may be formed with such substance as $GaO_xN_y$, $Si_3N_4$, $Al_2O_3$ and AlN, or their composite film.

Figure 6:
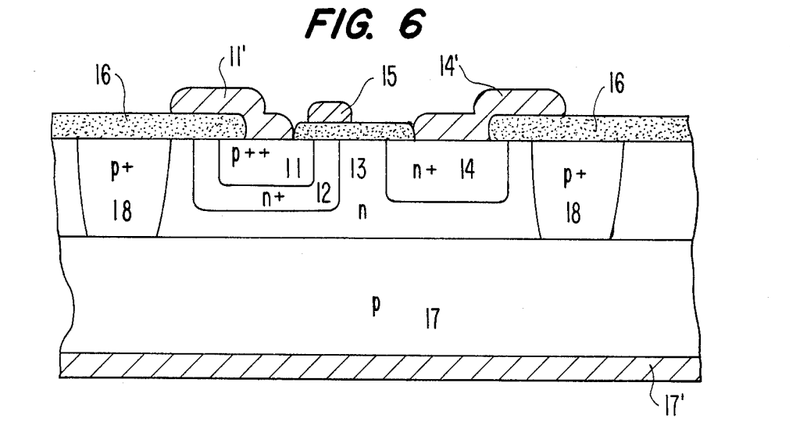

In FIGS. 2, 4 and 5 are shown the transistors of the present invention which are of the vertical structure. It should be understood that the transistor of the present invention can, no doubt, be formed as a lateral type also. Such an embodiment is shown in FIG. 6. The reference numerals of the respective constituting regions correspond to those of FIG. 5. In FIG. 6, the gate electrode 15 is provided only in the vicinity of the n+ type region 20 thereon. However, the gate electrode 15 may extend throughout the entire surface covering the source region as well as the drain region. In order to improve the controllability of current by the gate electrode in this lateral structure device, it is useful to design that portion of the n+ type region 12 which is located close to the gate electrode 15 to be smaller than the remainder thereof. This is because of the fact that tunnel phenomenon can take place more easily in that portion where the n+ type region 12 has a smaller thickness, and that, moreover, the potential of that thin portion is effectively controlled since it is located close to the gate electrode. In case of a GaAs device, the p type substrate 17 is replaced by a semi-insulating substrate, and the p+ type isolation region 18 is replaced by a semi-insulating region by relying on Proton or Helium bombardment.

Description of the gate electrode has hereinabove been made with respect only to an insulated gate type. It should be understood, however, that the present invention can be constructed equally effectively with a junction type gate or with a Schottky type gate.

Figure 7:
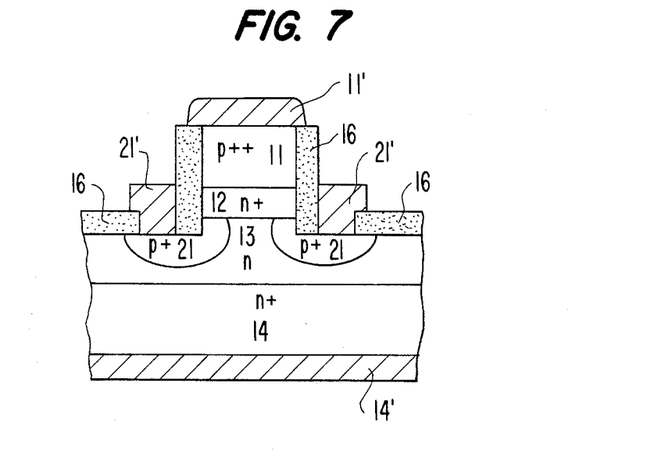

A device having a junction type gate structure is shown in FIG. 7. In this Figure, a p+ type region 21 represents a gate region. Numeral 21' represents a gate electrode. By applying a reverse voltage to the gate electrode to realize the non-conducting state, and by holding the gate region at zero potential or applying a forward voltage thereto, a conducting state is realized. In a device having this junction type gate structure, there is such drawback that a current by punching-through phenomenon can easily flow across the source region and the gate region.

In the device structure of FIG. 7, if, for example, the conductivity type of the n+ type drain region is replaced by a p+ type region, i.e. this p+ type region is called anode region such device will become a thyristor. That is, if those electrons which have been tunnel-injected from the source region are accumulated in the foreground of the anode region, causing the injection of holes from the anode region, such operation is that of a thyristor.

Figure 8:
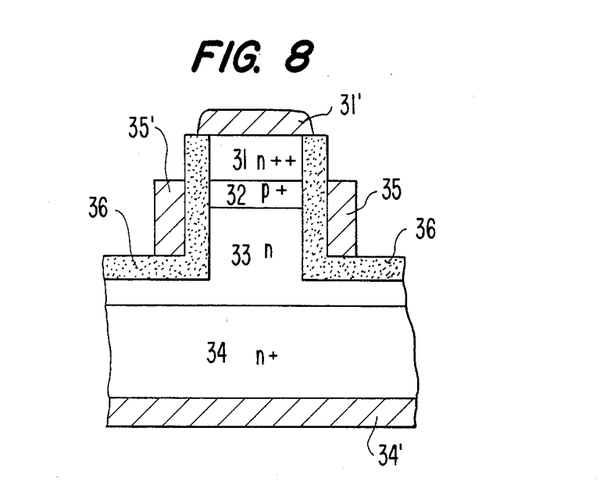

Description has been made above of those thyristors in which the source region and the anode region are constructed with high impurity concentration regions having opposite conductivity types relative to each other. It should be understood, however, that a transistor embodying the principle of the present invention can be constructed also in case the source region and the drain region are comprised of high impurity concentration regions having a same conductivity type. Such embodiment is shown in FIG. 8.

Figure 9:
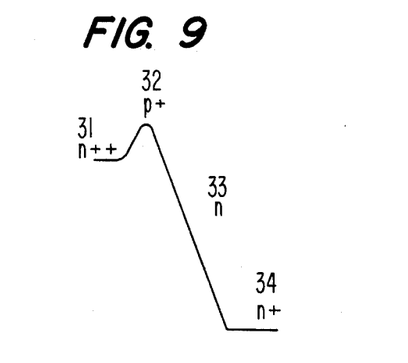
FIG. 9 is a chart showing the potential distribution in the channel region from the source region toward the drain region of the device shown in FIG. 8.

Numeral 31 represents an n++ type source region; 34 an n+ type drain region; 35, 35' represent gate electrodes, respectively; and 36 represents an insulation layer. Numeral 32 represents a p+ type region which forms a potential barrier for the source region 31, and this region 32 serves, so to speak, as an intrinsic gate region. Numeral 33 represents an n type region, and the impurity concentration of this region is selected so that this n type region 33 is almost depleted. The thickness and the impurity concentration of the p+ type region 32 are designed so that the entire region 32 is depleted by the built-in potential present across this region 32 and the n++ type source region 31, the built-in potential across this region 32 and the n+ type drain region 34, and the voltage applied to this n+ type drain region. The potential distribution in the channel region in the direction of the source to drain regions when, in such condition as mentioned above, a positive voltage is applied to the drain region is shown in FIG. 9.

In such instance, the p+ type region 32 which has become depleted forms a potential barrier for the source region 31. Injection of electrons from the source region 31 will become blocked by this potential barrier. In case the width of this potential barrier is large, i.e. in case the thickness of the p+ type region 32 is large, it will be understood that, even when the height of the potential barrier is lowered by the application of a gate voltage, there occurs no tunnel injection of carriers, and the current will be determined by those carriers which pass over the potential barrier. That is, in such instance, the operating mechanism of the device will be exactly the same as that of the conventional SITs. If, however, the width of the potential barrier is designed less than 1000Å, desirably less than 500Å, tunnel injection will become prominent, and thus the present invention can be realized. Since it is necessary that the p+ type region 32 be depleted during the period in which the device is in the operating state, the thickness $W_p$ of the p+ type region 32 and the impurity concentration $N_a$ of this region need to be selected to be about $9 \times 10^6$ $cm^{-1} < N_a W^2 < 5 \times 10^7$ $cm^{-1}$; such as, if W=500Å, $3.6 \times 10^{17}$ $cm^{-3} < N_a < 2 \times 10^{18}$ $cm^{-3}$, and if W=200Å, $2.25 \times 10^{18}$ $cm^{-3} < N_a < 1.25 \times 10^{19}$ $cm^{-3}$.

In these embodiments shown in FIGS. 2, 4, 5, 6 and 8, gate electrodes such as those indicated by 15, 15' and 35, 35' are comprised of highly-doped polysilicon, silicide or metal.

In a device constructed in the manner described above, when a positive voltage is applied to the gate electrode the potential barrier is lowered a flow of tunnel current takes place. Of course, when the height of the potential barrier is lowered to a certain degree, there will concurrently arise an injection of those carriers passing over the potential barrier. Thus, care should be taken with regard to such parameters as the impurity concentrations and the thicknesses of respective regions of the semiconductor device when designing a structure of the type described above.

Figure 10:
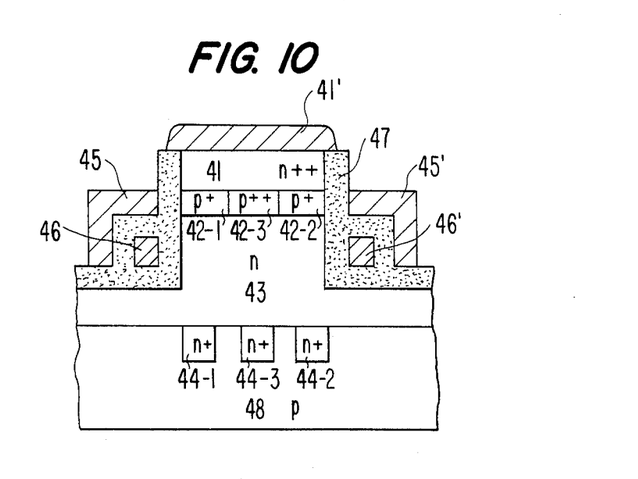

Description has been made above with respect to such instance wherein the function of the gate electrode which controls the tunnel injection of carriers is basically a certain type. In those embodiments described already, there is, needless to say, included such one as having a split-gate structure as shown in FIG. 4. However, there is no discrimination in the functions of respective gate regions and electrodes. However, in the device of the present invention, there may be provided a plurality of gate electrodes which control tunnel injection of current, and these gate electrodes are used in separate manner, and controlling voltages are applied to these gate electrodes separately, whereby it is possible to cause an operation with logical function. Such embodiment is shown in FIG. 10 as a model. In this Figure, reference numeral 41 represents an $n^{++}$ type source region; 44-1, 44-2 and 44-3 $n^+$ type drain regions, respectively; 45, 45', 46 and 46' gate electrodes, respectively; 41' a source electrode. Gate electrodes 45 and 45' are comprised of highly-doped polysilicon, silicide or metal. In this embodiment, those gate electrodes 46 and 46' are provided as floating electrodes. Floating gate electrodes 46 and 46' are usually comprised of highly-doped polysilicon. The region indicated at 42 is a tunnel-injection region. The central part of this region indicated by reference numeral 42-3 is comprised of an extremely high impurity concentration region. Both sides 42-1 and 42-2 of this region 42-3 are comprised of $p^+$ type regions having impurity concentrations less than that of the region 42-3. Gate voltages are applied to the gate electrodes 45 and 45'. In the state in which a large positive voltage is applied to the drain region 44, a positive voltage is applied to the gate electrode 45. Electrons will flow at a site located close to the left-hand side surface of the device. Among the flowing electrons, those which are accelerated into a high energy will pass over the potential barrier of the insulation layer 47, and will flow into the floating gate electrode 46 and will be stored therein. When electrons are stored in the floating gate 46, this gate electrode will be negatively charged. Therefore, electrons are kept away from the vicinity of the lefthand side surface. Similar phenomenon takes place at the right-hand side gate electrodes 45' and 46' as well. When positive voltages are applied to the drain region and the gate electrode and when, thus, electrons are stored in the floating gate electrode as described above, electrons will no longer flow in the vicinity of the surface thereof. By making use of such phenomenon, there will be performed the below-mentioned operation. That is, in case an operation is effected by returning the drain voltage and the gate voltage back to normal operating voltages, it will be noted that, in the state that no electrons are written in each of the floating gates 46 and 46', if positive gate voltages are applied to the gate electrodes 45 and 45', electrons will flow along the surface of that portion of the channel region which is located close to the respective gate electrodes. In the state that voltages are applied to the gate electrodes 45 and 45' when electrons are written in the floating gates 46 and 46', electrons will flow in such fashion as are gathering in the vicinity of the center of the channel region. As described above, it is possible to alter the site of flow of electrons in the channel region by the presence or absence of electrons in the floating gate electrodes. In the instant embodiment, the drain region is provided in the form of three separate drain regions such as a right-hand side drain 44-2, a middle drain 44-3 and a left-hand side drain 44-1, e.g. by forming a Schottky junction to each drain region at the surface and by separating it into three drain regions, it is possible to alter the drain electrode through which a current flows, depending on the state of writing in the floating gate electrodes, i.e. it is possible to realize logical operations.

Let us suppose here that electrons are written in the floating gates 46 and 46'. If a voltage is applied to either one of the gate electrodes 45 and 45' or to both of them, most of the current will flow through the middle drain region. If the floating gate 46 is written-in, and the floating gate 46' is not written-in, it is possible to cause the current to flow through the middle drain region by applying a voltage to the gate electrode 45, and to flow through the right-hand side drain region by an application of a voltage to the gate electrode 45', and to flow through both the middle and right-hand side drain regions if voltages are applied to both of the gate electrodes 45 and 45'.

Now, there are two instances for those electrons which are tunnel-injected from the source region to travel through the travelling region to the drain region. One of such patterns is that electrons run in drift fashion while being subjected to scattering by collision among themselves. The other pattern is the instance wherein these electrons travel while being accelerated progressively, substantially without suffering from scattering. The development of both of these patterns is determined by the relationship between the mean free path length and the distance of travel of electrons during which electrons are subjected to scattering. If the distance of travel of electrons is sufficiently greater as compared with the mean free path length, the flow of current will assume the drift travel mode while being subjected to scattering. If the distance of travel of electrons is identical with the length of mean free path or shorter than the latter, those carriers having a certain initial velocity will assume such mode of run that they are progressively accelerated of their speed without substantially being subjected to scattering. When electrons run without suffering from substantial scattering, the travelling speed of such electrons will become great, and accordingly the upper limit of frequency which is determined by the travel time will become extremely high.

The mean free path of GaAs is said to be several times greater than that of silicon. Accordingly, GaAs tends to exhibit the latter mode of travel of electrons more easily as compared with silicon. Therefore, the employment of GaAs can materialize high frequency operation of device as compared with the instance wherein silicon is used as the semiconductor material.

In the embodiments described above, description has been made that the impurity concentration of the source region which causes tunnel injection of carriers and the impurity concentration of the region which is directly in contact with this source region are spatially uniform. It should be understood, however, that such uniformity is not always necessary. The impurity concentration of that region which is required to cause most intensive tunnel injection of carriers is selected to be high, so that it is possible to enhance the tunnel injection efficiency.

It is needless to say that the semiconductor device according to the present invention is not limited to those embodiments described herein. It will be no doubt understood that a structure in which the conductivity types of the respective constituent semiconductor regions are reversed is also equally effective. In any way, a semiconductor device of the present invention need only to have the arrangement operative so that carriers are tunnel-injected from the source region, and that the amount of this injection is controlled by the static induction effect exerted by the gate voltage and the drain voltage. In order to develop a tunnel injection with good efficiency, the impurity concentration of the semiconductor region which participates in developing tunnel phenomenon is desirably set high. Moreover, the present invention contemplates depletion of such region to control the potential distribution via the capacitance of the depletion layer. In order to materialize this depletion, said highly-doped region must have a fine size. Thus, the semiconductor device of the present invention is essentially a fine- or minimum- structured device. A semiconductor device of the present invention, no doubt, is most useful in fabricating an ultra-high density and high-speed integrated semiconductor circuit. The smaller the size of the device becomes, the more effective it is in this respect. In addition, carriers are injected by virtue of the tunnel phenomenon directly from the high impurity concentration region. Therefore, there arises extremely little carrier storage effect in the vicinity of the source region, and the device is extremely suitable for high-speed operation.

In the specification and the drawings, there have been shown embodiments wherein the gate semiconductor region is formed with a highly-doped semiconductor region. It is, however, possible to form the gate region with a metal or silicide which is made of, for example, a compound of platinum and silicon, to form a Schottky junction, and to arrange a steep potential gradient in the foreground of the Schottky junction, to thereby cause tunnel injection of carriers.

It should be understood that the semiconductor devices according to the present invention can be manufactured by relying on known manufacturing methods employed in this field of technique.

What is claimed is:

1. A tunnel injection controlling type semiconductor device, comprising:
    a highly-doped source semiconductor region having a first conductivity type for supplying carriers;
    a highly-doped drain semiconductor region having a second conductivity type opposite to said first conductivity type for receiving said carriers;
    a channel semiconductor region having said second conductivity type disposed between said source region and said drain region in which the portion adjacent to said source region is highly-doped and the carrier concentration of the remaining part is lower than in said highly-doped portion of said channel region; and
    a gate provided on said device for controlling tunnel current flow from said source region to said drain region.

2. A tunnel injection controlling type semiconductor device according to claim 1 wherein said highly-doped region extends to a side face of said device.

3. A tunnel injection controlling type semiconductor device according to claim 1 in which:
    said gate is provided in plural segments.

4. A tunnel injection controlling type semiconductor device according to claim 1 in which:
    said source semiconductor region has an impurity concentration of $5 \times 10^{19} - 1 \times 10^{21}/cm^3$,
    said highly-doped portion of said channel region adjacent said source region has an impurity concentration of $5 \times 10^{17} - 1 \times 10^{19}/cm^3$,
    said remaining part of said channel region has an impurity concentration of $1 \times 10^{14} - 1 \times 10^{17}/cm^3$, and
    said drain semiconductor region has an impurity concentration of $1 \times 10^{18} - 5 \times 10^{20}/cm^3$.

5. A tunnel injection controlling type semiconductor device according to claim 1 in which:
    the impurity concentration of said highly-doped portion of the channel region adjacent said source semiconductor region has an impurity concentration N and has a thickness W, both of which are in a relationship of $9 \times 10^6 \text{ cm}^{-1} < N \cdot W^2 < 5 \times 10^7 \text{ cm}^{-1}$.

6. A tunnel injection controlling type semiconductor device, according to claim 1 in which:
    a metal gate layer is provided adjacent said channel region close to said source region for controlling a tunnel current flowing from said source region to said drain region.

7. A tunnel injection controlling type semiconductor device according to claim 6 in which:
    the source semiconductor region has an impurity concentration of $5 \times 10^{19} - 1 \times 10^{21}/cm^3$;
    the heavily doped part of the channel region adjacent the source region has an impurity concentration of $5 \times 10^{17} - 1 \times 10^{19}/cm^3$;
    the remaining part of the channel region has an impurity concentration of $1 \times 10^{14} - 1 \times 10^{17}/cm^3$; and
    the drain semiconductor region has an impurity concentration of $1 \times 10^{18} - 5 \times 10^{20}/cm^3$.

8. A tunnel injection controlling type semiconductor device according to claim 6 in which the highly-doped semiconductor part of the channel region adjacent to the source region has an impurity concentration N and has a thickness W where N and W are in a relationship of:

$$9 \times 10^6 \text{ cm}^{-1} < N \cdot W^2 < 5 \times 10^7 \text{ cm}^{-1}.$$

9. A tunnel injection controlling type semiconductor device according to claim 6 in which:
    said gate layer is provided in plural segments.

10. A tunnel injection controlling type semiconductor device according to claim 1 wherein said gate comprises at least one metallic gate electrode separated from said channel region by an insulator.

11. A tunnel injection controlling type semiconductor device, comprising:
    a highly-doped source semiconductor region of a first conductivity type for supplying carriers;
    a highly-doped drain semiconductor region of a second conductivity type opposite to the first conductivity type for receiving the carriers;
    a channel semiconductor region of a second conductivity type disposed between said source region and said drain region in which the portion of the channel region adjacent to the source region is more heavily doped than the remaining portion of the channel region; and
    at least one metallic gate region separated from the channel region by an insulator for controlling tunnel current flow from the source region to the drain region.

12. A tunnel injection controlling type semiconductor device according to claim 11 in which:
    the source semiconductor region has an impurity concentration of $5 \times 10^{19} - 1 \times 10^{21}/cm^3$;
    the heavily doped portion of the channel region adjacent the source region has an impurity concentration of $5 \times 10^{17} - 1 \times 10^{19}/cm^3$;
    the remaining portion of the channel region has an impurity concentration of $1 \times 10^{14} - 1 \times 10^{17}/cm^3$; and the drain semiconductor region has an impurity concentration of $1\times10^{18}-5\times10^{20}/cm^3$.

13. A tunnel injection controlling type semiconductor device according to claim 11, in which:
the more heavily-doped portion of the channel region adjacent to the source region has an impurity concentration N and has a thickness W, where N and W are in a relationship of:

$$9\times10^6\,cm^{-1}<N\cdot W^2<5\times10^7\,cm^{-1}.$$

14. A controlled tunnel injection semiconductor device, comprising:
a highly doped source region of first conductivity type,
a highly doped drain region of second conductivity type,
a channel region of said second conductivity type between said source and drain region, said channel region having a highly-doped portion adjacent said source region, said portion having a thickness W and an impurity concentration N in a relationship:

$$9\times10^6\,cm^{-1}<N\cdot W^2<5\times10^7\,cm^{-1}$$

said channel region having a lesser-doped portion between said highly-doped portion and said drain region, and
gate electrode means, situated adjacent said highly-doped portion of said channel region, for inducing therein an electric field sufficiently intense to cause tunnel current to flow through said channel region.

15. A tunnel injection device according to claim 14 wherein said gate electrode means comprises a metal gate electrode spaced from said highly-doped portion of said channel region by an insulating layer.

16. A tunnel injection device according to claim 15 wherein said source region, said channel region and said drain region are arranged laterally along a common face of said device, wherein said insulating layer is disposed on said common face, and wherein said gate electrode is atop said insulating layer.

17. A tunnel injection device according to claim 15 wherein said source region, said channel region and said drain region are arranged in a vertical structure, with at least said source and said highly-doped portion of said channel region extending to at least one vertical face of said structure, said insulating layer being disposed on said at least one vertical face, and said gate electrode being disposed on the side of said insulating layer opposite said vertical face.

18. A tunnel injection device according to claim 17 wherein said source region and at least the highly-doped portion of said channel region comprises multiple segments, and wherein said gate electrode has multiple segments.

19. A tunnel injection device according to claim 17 wherein said drain region is buried within a semiconductor substrate.

20. A tunnel injection device according to claim 14 wherein said gate electrode means comprises:
a highly-doped semiconductor gate region adjacent said channel region, and a gate electrode in contact with said semiconductor gate region.

21. A tunnel injection device according to claim 20 wherein said source region and said highly-doped portion of said channel region extend to a face of said device, said gate electrode means further comprising an insulative layer adjacent said face, said gate electrode being at least partially situated against said insulative layer opposite said highly-doped portion.

22. A tunnel injection device according to claim 14 in which:
the source region has an impurity concentration of $5\times10^{19}-1\times10^{21}/cm^3$;
the highly doped portion of said channel region has an impurity concentration of $5\times10^{17}-1\times10^{19}/cm^3$;
the lesser-doped portion of said channel region has an impurity concentration of $5\times10^{14}-1\times10^{17}/cm^3$; and
the drain region has an impurity concentration of $1\times10^{18}-5\times10^{20}/cm^3$.

23. A tunnel injection device according to claim 14 wherein said first conductivity is p-type and wherein said second conductivity is n-type, and further comprising:
means for applying a positive voltage to said drain region, and a positive controlling voltage to said gate electrode means.

24. A tunnel injection controlling type semiconductor device, comprising:
a highly-doped source semiconductor region of a first conductivity type for supplying carriers;
a highly-doped drain semiconductor region of a second conductivity type opposite to the first conductivity type for receiving said carriers;
a channel semiconductor region of the second conductivity type disposed between the source region and the drain region, in which the part of said channel region adjacent to said source region is highly-doped and the remaining part of said channel region is doped to a concentration lower than that of said highly-doped part of said channel region;
a highly-doped gate semiconductor region having the first conductivity type and located adjacent said channel region for controlling tunnel current flowing from said source region to said drain region; and
a metal layer contacting said gate region and serving as a gate electrode, said gate electrode and gate region controlling tunnel current flow from said source region to said drain region.

25. A tunnel injection controlling type semiconductor device according to claim 24 in which:
the source semiconductor region has an impurity concentration of $5\times10^{19}-1\times10^{21}/cm^3$;
the highly-doped part of the channel region adjacent the source region has an impurity concentration of $5\times10^{17}-1\times10^{19}/cm^3$,
the remaining part of the channel region has an impurity concentration of $1\times10^{14}-1\times10^{17}/cm^3$; and
the drain semiconductor region has an impurity concentration of $1\times10^{18}-5\times10^{20}/cm^3$.

26. A tunnel injection controlling type semiconductor device according to claim 24 in which:
the highly-doped part of the channel region adjacent to the source region has an impurity concentration N and has a thickness W, where N and W are in a relationship of:

$$9\times10^6\,cm^{-1}<N\cdot W^2<5\times10^7\,cm^{-1}$$

27. A tunnel injection controlling type semiconductor device according to claim 24 in which:
said gate electrode is provided in plural segments.

* * * * *